(12) United States Patent
Tamura

(10) Patent No.: US 8,994,254 B2
(45) Date of Patent: Mar. 31, 2015

(54) VIBRATING PIECE HAVING A SUPPORT ARM SECTION INCLUDING MOUNT SECTIONS IN A MOUNT REGION THEREOF

(71) Applicant: SII Crystal Technology Inc., Chiba (JP)

(72) Inventor: Masanori Tamura, Chiba (JP)

(73) Assignee: SII Crystal Technology Inc., Chiba (JP)

( * ) Notice: Subject to any disclaimer, the term of this patent is extended or adjusted under 35 U.S.C. 154(b) by 0 days.

(21) Appl. No.: 14/188,366

(22) Filed: Feb. 24, 2014

(65) Prior Publication Data

US 2014/0241132 A1 Aug. 28, 2014

(30) Foreign Application Priority Data

Feb. 25, 2013 (JP) ................. 2013-035058

(51) Int. Cl.
| | |
|---|---|
| *H03H 9/21* | (2006.01) |
| *H01L 41/08* | (2006.01) |
| *H03H 9/05* | (2006.01) |
| *H03H 9/10* | (2006.01) |
| *H03B 5/36* | (2006.01) |

(52) U.S. Cl.
CPC .. *H03H 9/21* (2013.01); *H03B 5/36* (2013.01); *H03H 9/0514* (2013.01); *H03H 9/1014* (2013.01)
USPC .......................................... 310/370; 310/344

(58) Field of Classification Search
CPC ............ H03H 9/19; H03H 9/21; H03H 9/215
USPC ............................ 310/370; 331/156; 333/200
See application file for complete search history.

(56) References Cited

U.S. PATENT DOCUMENTS

| | | | | |
|---|---|---|---|---|
| 3,462,939 | A | * | 8/1969 | Kato Yoshiaki et al. ....... 310/328 |
| 2006/0279176 | A1 | * | 12/2006 | Dalla Piazza et al. ......... 310/348 |
| 2009/0015107 | A1 | * | 1/2009 | Dalla Piazza .................. 310/348 |
| 2011/0305120 | A1 | * | 12/2011 | Hessler et al. ................. 368/159 |
| 2012/0098389 | A1 | * | 4/2012 | Dalla Piazza et al. ......... 310/348 |
| 2014/0029179 | A1 | * | 1/2014 | Yamada .................... 361/679.01 |

FOREIGN PATENT DOCUMENTS

| | | | |
|---|---|---|---|
| JP | 2002141770 A | * | 5/2002 |
| JP | 2003-163568 A | | 6/2003 |
| JP | 2006-345517 A | | 12/2006 |
| JP | 2006-345519 A | | 12/2006 |
| JP | 2011015101 A | * | 1/2011 |

* cited by examiner

*Primary Examiner* — J. San Martin
(74) *Attorney, Agent, or Firm* — Brinks Gilson & Lione

(57) ABSTRACT

A piezoelectric vibrator is provided in which a piezoelectric vibrating piece is accommodated in a package, the piezoelectric vibrating piece including: a pair of vibrating arm sections; a base section to which each base end of the pair of vibrating arm sections is connected; and a support arm section that is connected to the base section between the pair of vibrating arm sections and extends from the base section to the same side as the vibrating arm sections, in which the piezoelectric vibrating piece is supported within the package in mount sections provided in the support arm section, and in which the mount sections are provided in a region which is defined between a position of which a distance from an end section of the base section opposite to the side where the support arm section is connected to the side of a leading end of the support arm section is 25% of a width dimension of the base section along the width direction and a position of which the distance is 65% of the width dimension.

7 Claims, 11 Drawing Sheets

VIBRATING PIECE HAVING A SUPPORT ARM SECTION INCLUDING MOUNT SECTIONS IN A MOUNT REGION THEREOF

RELATED APPLICATIONS

This application claims priority under 35 U.S.C. §119 to Japanese Patent Application No. 2013-035058 filed on Feb. 25, 2013, the entire content of which is hereby incorporated by reference.

BACKGROUND OF THE INVENTION

1. Field of the Invention

The present invention relates to a piezoelectric vibrator, an oscillator, an electronic apparatus and a radio controlled timepiece.

2. Background Art

For example, in a cellular phone or a portable information terminal apparatus, a piezoelectric vibrator utilizing crystals or the like is often used as a device which is used in a time source, a timing source of a control signal or the like, a reference signal source or the like. As this type of the piezoelectric vibrator, a piezoelectric vibrator is known in which a piezoelectric vibrating piece is hermetically sealed within a package in which a cavity is formed.

In the package described above, the cavity is formed by utilizing a concave section, which is formed by overlapping one substrate in which the concave section is formed with another substrate and by bonding both the substrates.

The piezoelectric vibrating piece includes a pair of vibrating arm sections that are disposed in parallel side by side in a width direction and a base that supports the side of a base end of the pair of vibrating arm sections in a cantilever manner, and is configured to vibrate (oscillate) with a predetermined frequency so that the pair of vibrating arm sections separate from or approach each other in a width direction starting from the side of the base end section thereof.

In the piezoelectric vibrating piece, a mount electrode formed in a mount section of the base section is bonded to a leading-out electrode formed on the substrate of the package by a conductive adhesive, a metal bump or the like.

However, when operating the piezoelectric vibrating piece, it is known that vibration leakage (leakage of vibration energy) occurs from the mount section of the base section to the side of the package. If the vibration leakage occurs, since a resonance frequency of the piezoelectric vibrating piece is no longer stable, it is necessary to suppress the vibration leakage as much as possible.

Thus, a piezoelectric vibrating piece including a pair of vibrating arm sections extending along each other, a base section to which each base end of the pair of vibrating arm sections is connected, and a support arm section that is connected to the base section between the pair of vibrating arm sections and extends from the base section along the vibrating arm sections is disclosed in JP-A-2003-163568, JP-A-2006-345517 and JP-A-2006-345519. Then, a configuration is disclosed which suppresses the vibration leakage and stabilizes the vibration of the vibrating arm sections by securing a long distance from the mount section in the support arm section to the vibrating arm sections.

SUMMARY OF THE INVENTION

However, in the related art described above, the vibration transmitted from the mount section to the side of the package is suppressed by ensuring a long distance from the mount section in the support arm section to the vibrating arm section but a configuration capable of suppressing the vibration leakage further effectively is required.

Thus, an object of the invention is to provide a piezoelectric vibrator capable of suppressing the vibration leakage to the side of the package in the mount section of the piezoelectric vibrating piece as much as possible, an oscillator, an electronic apparatus and a radio controlled timepiece.

The invention provides the following units to solve the problems described above.

That is, according to an aspect of the invention, there is provided a piezoelectric vibrator in which a piezoelectric vibrating piece is accommodated in a package, the piezoelectric vibrating piece including: a pair of vibrating arm sections which are disposed at a distance from each other in a width direction of a base section; the base section to which each base end of the pair of vibrating arm sections is connected; and a support arm section that is connected to the base section between the pair of vibrating arm sections and extends from the base section to the same side as the pair of vibrating arm sections. The piezoelectric vibrating piece is supported within the package in mount sections provided in the support arm section. In the support arm section, the mount sections are provided in a region which is defined between a position of which a distance from an end section of the base section opposite to the side where the support arm section is connected to the side of a leading end of the support arm section is 25% of a width dimension of the base section along the width direction and a position of which the distance is 65% of the width dimension.

As a result of intensive study of the present inventors, the inventors found that the vibration caused by the vibration of the vibrating arm sections, which is transmitted to the support arm section, is reduced in a specific position of the support arm section regardless of the length of the support arm section (it is a node). Particularly, the vibration of the piezoelectric vibrating piece is reduced in a predetermined position on the support arm section of which the distance from the end section of the base section opposite to the side where the support arm section is connected to the side of the leading end of the support arm section is near 45% of the width dimension of the base section in the direction along the width direction. Then, even if the length of the support arm section is varied, the inventors found that the vibration remarkably reduced near 45% of the width dimension of the base section in the direction along the width direction is unchanged.

Then, in the invention, the vibration leakage is further effectively suppressed by forming the mount sections to the substrate of the piezoelectric vibrating piece in a specific position of the vicinity of 45% described above. That is, since the vicinity of 45% described above is a point where the vibration of the support arm section is suppressed as much as possible, the vibration leakage from the mount sections to the substrate is suppressed by providing the mount sections near thereof.

Specifically, in the piezoelectric vibrator of the invention, the mount sections are provided in the region of which the distance from the end section of the base section opposite to the side where the support arm section is connected to the side of the leading end of the support arm section is 45±20% of the width dimension of the base section along the width direction, that is, between 25% and 65%. Therefore, it is possible to suppress the vibration leakage from the piezoelectric vibrating piece as much as possible.

In the piezoelectric vibrator, a width dimension of the support arm section may be 1.0 to 5.0 times a width dimension of the vibrating arm sections in a width direction orthogonal to an extending direction of the vibrating arm sections and the support arm section, and a length dimension of the support arm section from the base section may be 0.5 to 2.5 times the width dimension of the base section.

In this case, it is possible to effectively suppress the vibration leakage in the piezoelectric vibrating piece within the dimension range as described above. Further, since the position of the center of gravity of the piezoelectric vibrating piece is easily positioned near the mount sections by positioning the mount sections within the dimension range as described above, it is possible to support the piezoelectric vibrating piece near the center of gravity of the piezoelectric vibrating piece and it is possible to make a good balance in the installation of the piezoelectric vibrating piece.

In the piezoelectric vibrator, a cutout section that is recessed along in the width direction may be formed in at least one side of a portion on the side of the base section from the mount sections in the base section and the support arm section.

In this case, it is possible to easily attenuate the vibration transmitted from the vibrating arm sections to the support arm section by providing the cutout section and it is possible to further effectively suppress the vibration leakage.

In addition, according to another aspect of the invention, there is provided an oscillator including: the piezoelectric vibrator according to the aspect of the invention, in which the piezoelectric vibrator is electrically connected to an integrated circuit as an oscillator.

In addition, according to still another aspect of the invention, there is provided an electronic apparatus including: the piezoelectric vibrator according to the aspect of the invention, in which the piezoelectric vibrator is electrically connected to a timer section.

In addition, according to still another aspect of the invention, there is provided a radio controlled timepiece including: the piezoelectric vibrator according to the aspect of the invention, wherein the piezoelectric vibrator is electrically connected to a filter section.

In the oscillator, the electronic apparatus and the radio controlled timepiece according to the aspect of the invention, it is possible to provide a product capable of suppressing the vibration leakage from the piezoelectric vibrating piece as much as possible by including the piezoelectric vibrator of the aspect of the invention.

According to the aspect of the invention, it is possible to suppress the vibration leakage to the substrate in the mount sections of the piezoelectric vibrating piece as much as possible.

DETAILED DESCRIPTION OF THE PREFERRED EMBODIMENTS

Figure 1:
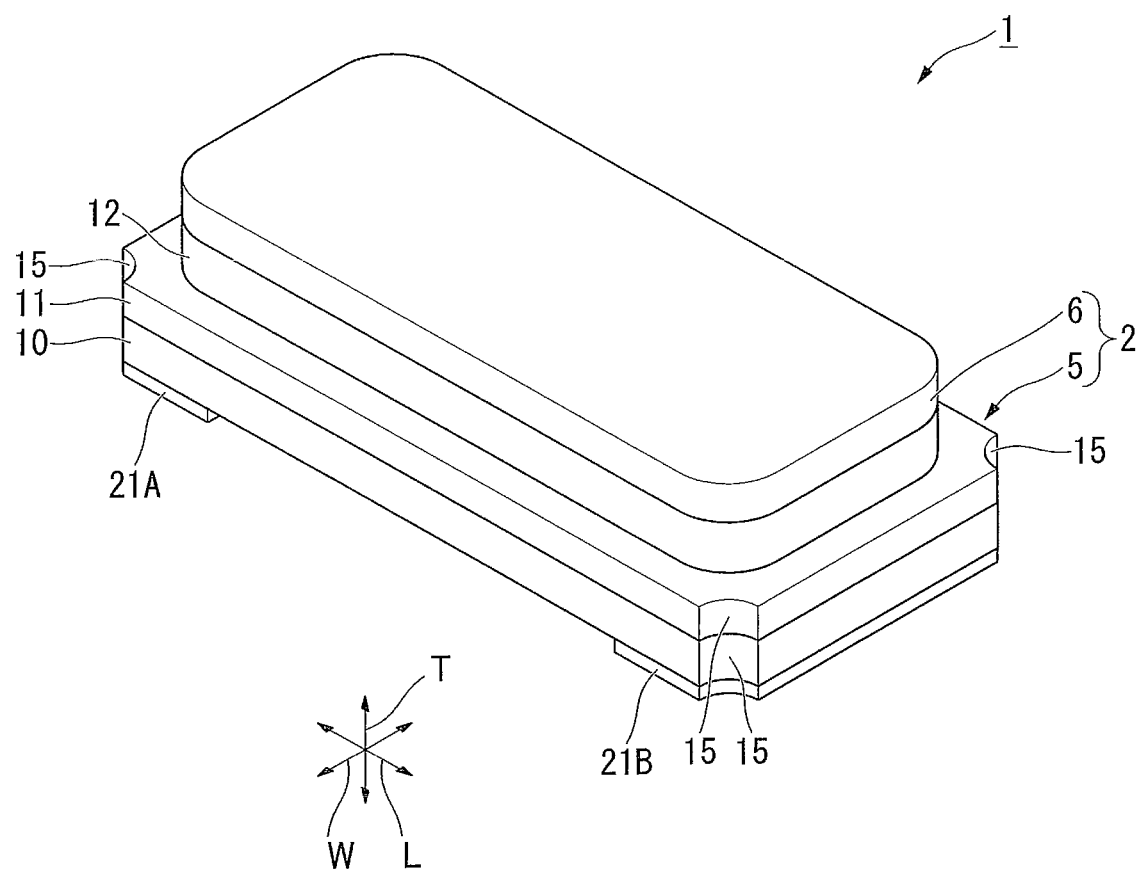
FIG. 1 is an external perspective view of a piezoelectric vibrator according to a first embodiment of the invention.
Figure 2:
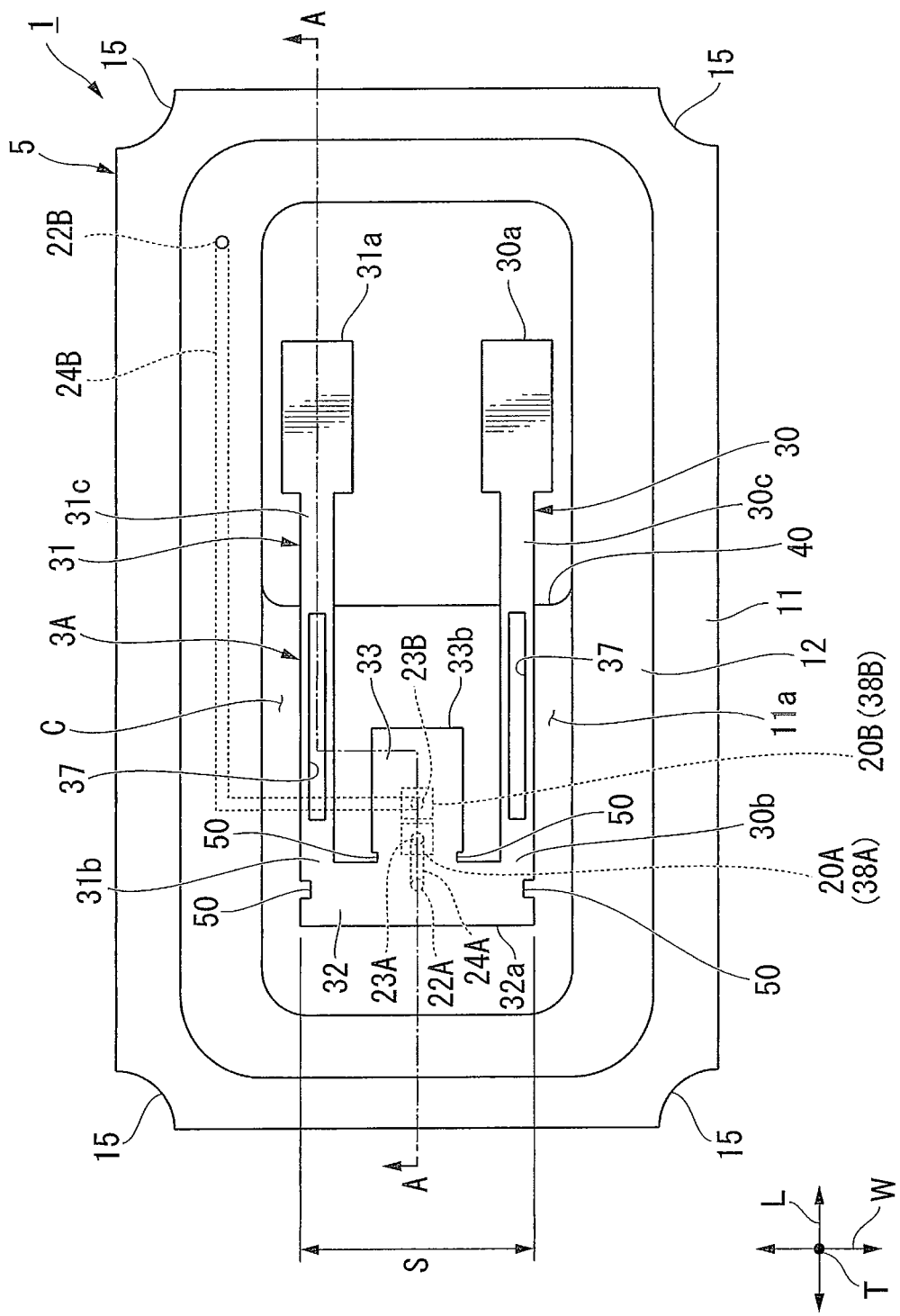
FIG. 2 is an internal configuration view of the piezoelectric vibrator illustrated in FIG. 1 and a view of a piezoelectric vibrating piece viewed from above in a state where a sealing plate is removed.
Figure 3:
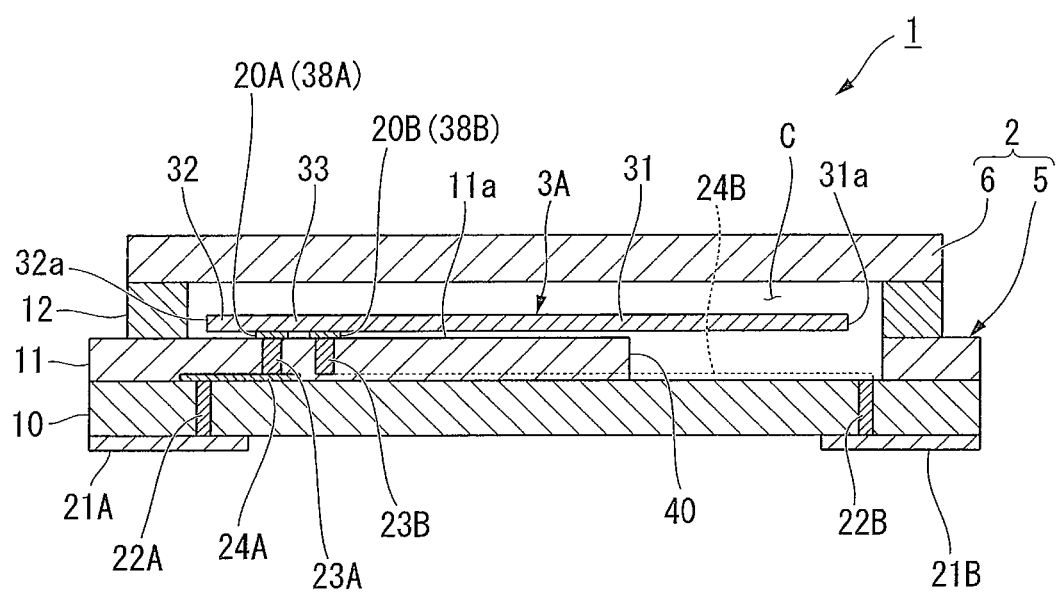
FIG. 3 is a cross-sectional view of the piezoelectric vibrator taken along line A-A in FIG. 2.
Figure 3:
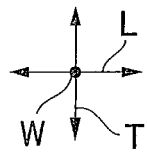
Figure 4:
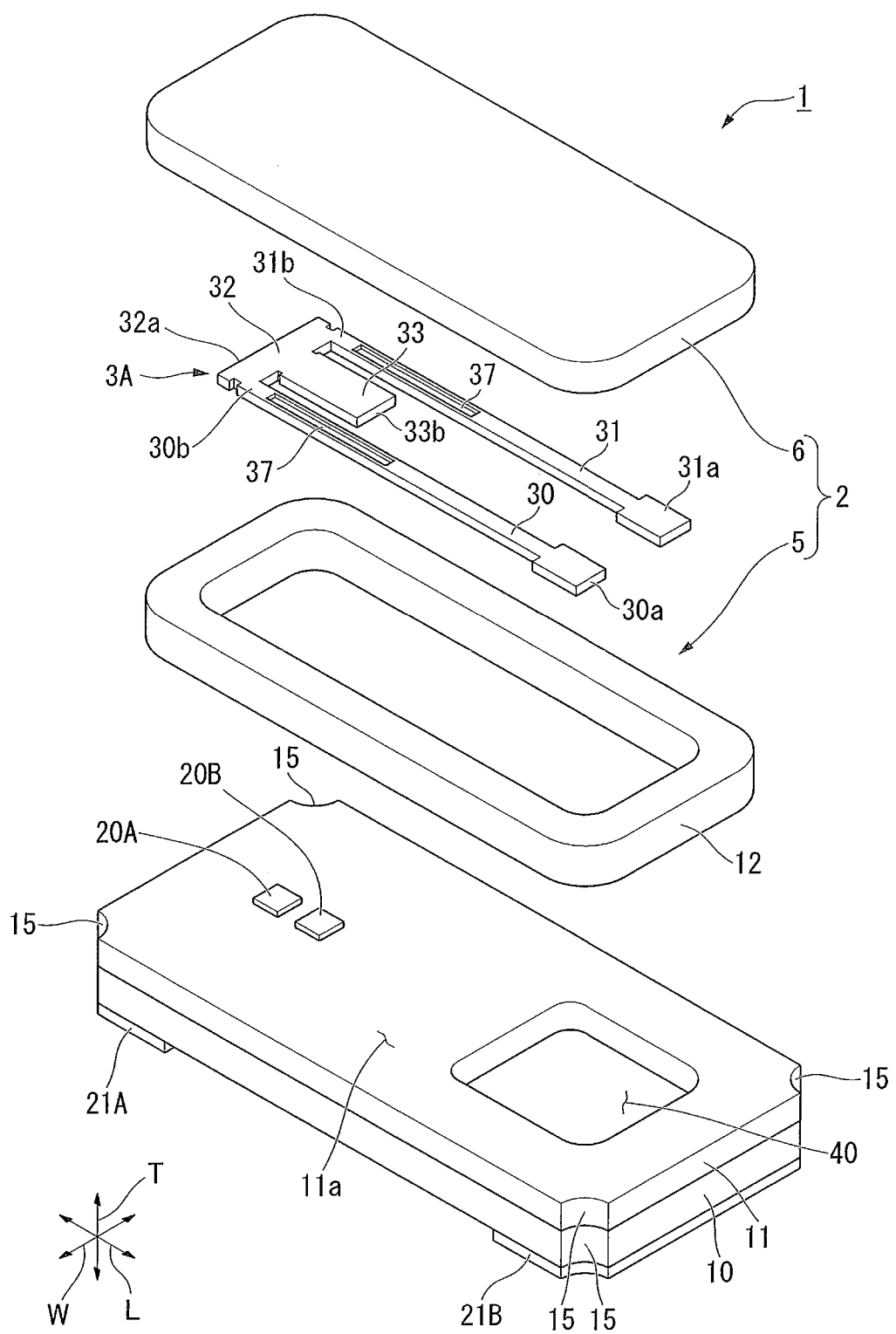
FIG. 4 is an exploded perspective view of the piezoelectric vibrator illustrated in FIG. 1.

Hereinafter, embodiments of the invention will be described with reference to the drawings.
First Embodiment
Configuration of Piezoelectric Vibrator As illustrated in FIGS. 1 to 4, a piezoelectric vibrator 1 of the embodiment is a surface mounting vibrator of a ceramic package type including a package 2 having a cavity C that is hermetically sealed on the inside thereof and a tuning fork type piezoelectric vibrating piece 3A accommodated in the cavity C.

The piezoelectric vibrator 1 is formed in a substantially rectangular parallelepiped shape and a longitudinal direction of the piezoelectric vibrator 1 is referred to as a length direction L, a short direction is referred to as a width direction W, and a direction orthogonal to the length direction L and the width direction W is referred to as a thickness direction T in a plan view in the embodiment.

The package 2 includes a package body 5 and a sealing plate 6 that is bonded to the package body 5 and forms the cavity C between the package body 5 and the sealing plate 6.

The package body 5 includes a first base substrate 10 and a second base substrate 11 bonded to each other in a state of being mutually superimposed, and a seal ring 12 bonded on the second base substrate 11.

The first base substrate 10 is a substrate made of ceramic formed in a substantially rectangular shape in a plan view. The second base substrate 11 is a substrate that is made of ceramic formed in a substantially rectangular shape in a plan view having the same external shape as that of the first base substrate 10, and is integrally bonded to the first base substrate 10 by sintering or the like in a state of being superimposed on the first base substrate 10.

A cutout section 15 having a quarter-circle shape in a plan view is formed throughout an entirety of both the substrate 10 and 11 in thickness direction T in four corners of the first base substrate 10 and the second base substrate 11. The first base substrate 10 and the second base substrate 11 are produced by, for example, superimposing and bonding two sheets of wafer-shaped ceramic substrates, and forming a plurality of through holes which pass through the two ceramic substrates in a matrix shape, and then cutting the two ceramic substrates into a grid pattern, based on each through hole. At this time, the cutout section 15 is formed by dividing the through hole into four.

In addition, an upper surface of the second base substrate 11 is a mounting surface 11a corresponding to an internal wall on which the piezoelectric vibrating piece 3A is mounted.

Moreover, the first base substrate 10 and the second base substrate 11 are made of ceramic and, for example, a particular ceramic material may be High Temperature Co-Fired Ceramic (HTCC) made of alumina or Low Temperature Co-Fired Ceramic (LTCC) made of glass ceramic or the like.

The seal ring 12 is a conductive frame-shaped member that is slightly smaller than the external shape of the first base substrate 10 and the second base substrate 11, and is bonded to the mounting surface 11a of the second base substrate 11.

Particularly, the seal ring 12 is bonded to the mounting surface 11a by baking of a brazing material such as silver brazing, a solder material or the like, or is bonded to a metal bond layer formed on the mounting surface 11a by welding or the like (for example, by vapor depositing or sputtering or the like in addition to electroplating or electroless plating).

Moreover, for example, a material of the seal ring 12 includes nickel-based alloys or the like and, particularly, may be selected from Kovar, Elinvar, Invar, 42-Alloy or the like. Particularly, a material of the seal ring 12 is preferably selected from a material having a coefficient of thermal expansion similar to that of the first base substrate 10 and the second base substrate 11 made of ceramic. For example, as the first base substrate 10 and the second base substrate 11, if alumina having the coefficient of thermal expansion of $6.8 \times 10^{-6}/°$ C. is used, Kovar having the coefficient of thermal expansion of $5.2 \times 10^{-6}/°$ C. or 42-Alloy having the coefficient of thermal expansion of 4.5 to $6.5 \times 10^{-6}/°$ C. is preferably used as the seal ring 12.

The sealing plate 6 is a conductive substrate superimposed on the seal ring 12 and is hermetically bonded to the package body 5 by bonding to the seal ring 12. Then, a space defined by the sealing plate 6, the seal ring 12 and the mounting surface 11a of the second base substrate 11 serves as the cavity C which is hermetically sealed.

Moreover, for example, a welding method of the sealing plate 6 may include seam welding by contact of a roller electrode, laser welding, ultrasonic welding or the like. In addition, in order to reliably perform the welding between the sealing plate 6 and the seal ring 12, bonding layers of nickel, metal and the like which are compatible with each other are preferably formed at least on a lower surface of the sealing plate 6 and an upper surface of the seal ring 12, respectively.

However, a pair of electrode pads 20A and 20B which are connection electrodes connected to the piezoelectric vibrating piece 3A are formed on the mounting surface 11a of the second base substrate 11 at an interval in the length direction L, and a pair of external electrodes 21A and 21B are formed on a lower surface of the first base substrate 10 at an interval in the length direction L.

For example, the electrode pads 20A and 20B, and the external electrodes 21A and 21B are single-layer films of a single metal or a laminated film of different laminated metals formed by vapor depositing, sputtering or the like, and are electrically connected to each other.

Detailed description will be made on this point.

A first penetration electrode 22A, which is electrically connected to the external electrode 21A of one side and passes through the first base substrate 10 in the thickness direction T, is formed on one side of the first base substrate 10, and a second penetration electrode 23A, which is electrically connected to the electrode pad 20A of one side and passes through the second base substrate 11 in the thickness direction T, is formed on one side of the second base substrate 11. Then, a connection electrode 24A of one side that connects the first penetration electrode 22A of one side and the second penetration electrode 23A of one side is formed between the first base substrate 10 and the second base substrate 11. Therefore, the electrode pad 20A of one side and the external electrode 21A of one side are electrically connected to each other.

In addition, a first penetration electrode 22B, which is electrically connected to the external electrode 21B of the other side and passes through the first base substrate 10 in the thickness direction T, is formed on the other side of the first base substrate 10, and a second penetration electrode 23B, which is electrically connected to the electrode pad 20B of the other side and passes through the second base substrate 11 in the thickness direction T, is formed on the other side of the second base substrate 11. Then, a connection electrode 24B of the other side that connects the first penetration electrode 22B of the other side and the second penetration electrode 23B of the other side is formed between the first base substrate 10 and the second base substrate 11. Therefore, the electrode pad 20B of the other side and the external electrode 21B of the other side are electrically connected to each other.

Moreover, the connection electrode 24B of the other side is, for example, patterned so as to extend beneath the seal ring 12 along the seal ring 12 to avoid a concave section 40 described below.

The concave section 40 is formed in a portion facing leading ends 30a and 31a of a pair of vibrating arm sections 30 and 31 of the piezoelectric vibrating piece 3A described below in the mounting surface 11a of the second base substrate 11. The concave section 40 is formed to avoid contact with the leading ends 30a and 31a of the vibrating arm sections 30 and 31 if the vibrating arm sections 30 and 31 are displaced (bending deformed) in the thickness direction T due to influence of impact by dropping or the like. The concave section 40 is a through hole passing through the second base substrate 11 and is formed in a square shape in a plan view having four round corners on the inside of the seal ring 12.

Piezoelectric Vibrating Piece

The piezoelectric vibrating piece 3A described above is a tuning fork type vibrating piece formed from a piezoelectric material such as crystal, lithium tantalate or lithium niobate. The piezoelectric vibrating piece 3A includes the pair of vibrating arm sections 30 and 31 extending along each other in the length direction L; a base section 32 that is connected to each of base ends 30b and 31b of the pair of vibrating arm sections 30 and 31, and extends in the width direction W; and a support arm section 33 that is connected to the base section 32 between the pair of vibrating arm sections 30 and 31, and extends along the vibrating arm sections 30 and 31 from the base section 32. Moreover, the shape of the piezoelectric vibrating piece 3A is not limited to the embodiment and, for example, the shape thereof may be formed such that the vibrating arm sections 30 and 31 extend by being inclined approximately 5 degrees at the maximum in the length direction L. That is, the shape of the piezoelectric vibrating piece 3A is not specifically limited as long as the vibrating arm sections 30 and 31 are provided at a distance from each other in the width direction W of the base section, and the support arm section 33 is provided therebetween.

The pair of vibrating arm sections 30 and 31 is a hammerhead type in which, for example, a width dimension on the side of the leading ends 30a and 31a is greater than that on the side of the base ends 30b and 31b. A weight and moment of inertia when vibrating on the side of the leading ends 30a and 31a of the vibrating arm sections 30 and 31 during the time of vibrating are higher. Therefore, it is possible to easily vibrate the vibrating arm sections 30 and 31, to shorten lengths of the vibrating arm sections 30 and 31, and to reduce the size thereof.

Moreover, the pair of vibrating arm sections 30 and 31 is not limited to the hammerhead type.

Each of the pair of vibrating arm sections 30 and 31 includes a groove section 37 formed along the longitudinal direction (an extending direction) of the vibrating arm sections 30 and 31 on both main surfaces 30c and 31c thereof.

The groove section 37 is, for example, formed from the side of the base ends 30b and 31b of the vibrating arm sections 30 and 31 to a portion approximately near the center thereof.

The pair of vibrating arm sections 30 and 31 includes a weight metal film (not illustrated) coated on an outer surface for adjusting a frequency so that its own vibration is performed within a predetermined frequency range.

The weight metal film (not illustrated) includes, for example, a rough adjustment film (not illustrated) for roughly adjusting the frequency and a fine adjustment film (not illustrated) for finely adjusting the frequency.

The adjustment of the frequency is performed by the weight adjustment of the rough adjustment film and the fine adjustment film, and the frequency of the pair of vibrating arm sections 30 and 31 is adjusted so as to fall within a predetermined target frequency.

Figure 5A:
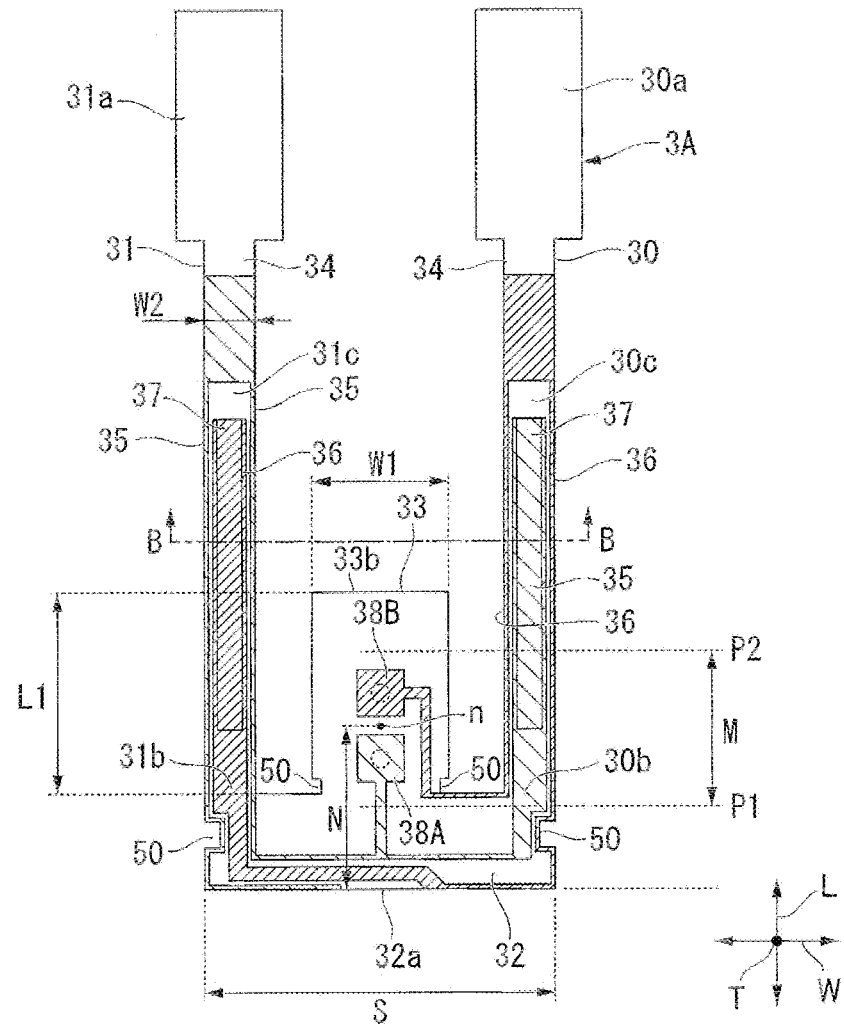
FIG. 5A is a top plan view of the piezoelectric vibrating piece according to the first embodiment and FIG. 5B is a cross-sectional view taken along line B-B in FIG. 5A.
Figure 5B:
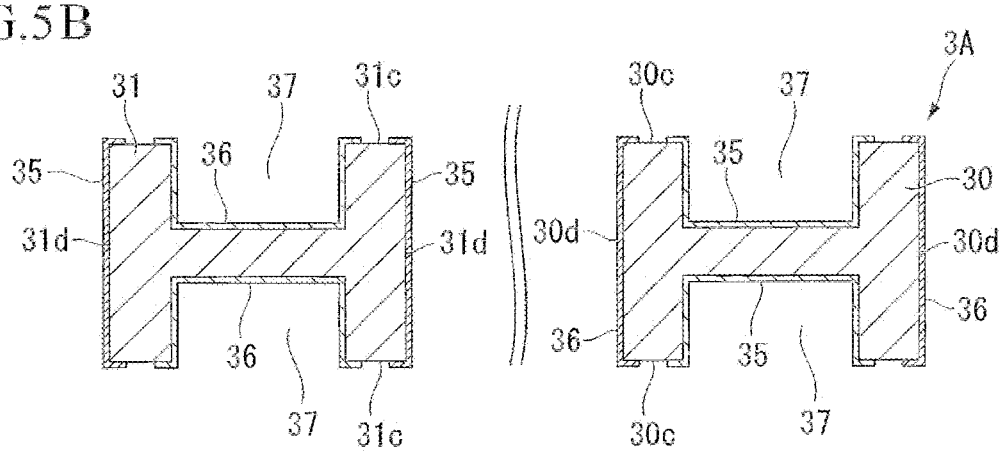

In addition, as illustrated in FIGS. 5A and 5B, the pair of vibrating arm sections 30 and 31 includes excitation electrodes formed of a first excitation electrode 35 and a second excitation electrode 36 which vibrate the pair of vibrating arm sections 30 and 31 on a surface of a piezoelectric body (a piezoelectric plate 34) made of a piezoelectric material.

The excitation electrodes formed of the first excitation electrode 35 and the second excitation electrode 36 are patterned in a state of being electrically insulated with respect to each other on an outer surface of the pair of vibrating arm sections 30 and 31, and vibrate the pair of vibrating arm sections 30 and 31 with a predetermined frequency in a direction separating from or approaching each other.

More particularly, as illustrated in FIGS. 5A and 5B, for example, the first excitation electrode 35 is continuously provided mainly on the groove section 37 of the vibrating arm section 30 and on both side surfaces 31d of the vibrating arm section 31 along the length direction L that is the extending direction of the vibrating arm sections 30 and 31, respectively. Further, the second excitation electrode 36 is continuously provided mainly on both side surfaces 30d of the vibrating arm section 30 and on the groove section 37 of the vibrating arm section 31 along the length direction L that is the extending direction of the vibrating arm sections 30 and 31, respectively.

A pair of mount electrodes 38A and 38B are provided on the outer surface of the support arm section 33 as mount sections when mounting the piezoelectric vibrating piece 3A. The mount electrode 38A of one side is formed by being continuously patterned to the first excitation electrode 35 described above, and the mount electrode 38B of the other side is formed by being continuously patterned to the second excitation electrode 36 described above.

The mount electrodes 38A and 38B are capable of feeding power from the external electrodes 21A and 21B to the first excitation electrode 35 and the second excitation electrode 36 by being electrically connected to the electrode pads 20A and 20B when mounting the piezoelectric vibrating piece 3A.

The piezoelectric vibrating piece 3A configured as described above is mounted so that the pair of mount electrodes 38A and 38B comes into contact with the pair of electrode pads 20A and 20B through a metal bump, a conductive adhesive (not illustrated) or the like. Therefore, the piezoelectric vibrating piece 3A is supported by the support arm section 33 in a state of being floated from the mounting surface 11a of the second base substrate 11, and the side of the base ends 30b and 31b of the pair of vibrating arm sections 30 and 31 is supported through the base section 32 in a cantilever manner. In addition, the piezoelectric vibrating piece 3A is in a state where the pair of mount electrodes 38A and 38B are electrically connected to the pair of electrode pads 20A and 20B, respectively.

Then, when applying a predetermined voltage to the external electrodes 21A and 21B, a current flows to the pair of excitation electrodes 35 and 36, and the pair of vibrating arm sections 30 and 31 vibrate with a predetermined resonance frequency in the direction separating from or approaching each other (the width direction W) by interaction of the excitation electrodes 35 and 36 with each other.

The vibration of the pair of vibrating arm sections 30 and 31 is used as a time source, a timing source of a control signal, a reference signal source or the like.

Here, in the piezoelectric vibrating piece 3A according to the embodiment, the mount electrodes 38A and 38B are provided in a specific position described below in the support arm section 33.

That is, the pair of mount electrodes 38A and 38B is provided within a region on the support arm section 33, of which a distance from an end section 32a of the base section 32 opposite to the side where the support arm section 33 is connected to the side of a leading end 33b of the support arm section 33 is 45±20% of a width dimension S of the base section 32 in the width direction W, that is, within a mount region M that is defined between a position P1 which is at a distance of 25% of the width dimension S from the end section 32a and a position P2 which is at a distance of 65% of the width dimension S from the end section 32a. Thus, the mount electrodes 38A and 38B are mounted so as to come into contact with the pair of electrode pads 20A and 20B.

Specifically, in the embodiment, the width dimension S of the base section 32 is 500 μm and the pair of mount electrodes 38A and 38B is provided within the mount region M defined by a range of which the distance from the end section 32a of the base section 32 in the length direction L is 125 μm (the position P1) to 325 (the position P2) μm in the piezoelectric vibrating piece 3A. The pair of mount electrodes 38A and 38B is mounted so as to come into contact with the pair of electrode pads 20A and 20B.

Moreover, in the piezoelectric vibrating piece 3A, the length from the end section 32a of the base section 32 to the leading end of the vibrating arm sections 30 and 31 is 900 μm to 1200 μm and the dimension of the base section 32 in the length direction L is 50 μm to 150 μm. In addition, the length dimension of the vibrating arm sections 30 and 31 from a position connected to the base section 32 is 750 μm to 1150 μm, the length dimension of the support arm section 33 from a position connected to the base section 32 is 300 μm or more, and the width dimension of the support arm section is 100 μm or more. In addition, the mount electrodes 38A and 38B are substantially square shapes of 100 μm×100 μm.

Here, in the support arm section 33 in FIGS. 5A and 5B, a point n of which a distance from the end section 32a of the base section 32 in the length direction L is 225 μm (length dimension N) is indicated. The point n (hereinafter, referred to as a position n) indicates a nodal point (node) where the vibration transmitted from the vibrating arm sections 30 and 31 to the support arm section 33 is suppressed as much as possible. Moreover, the position n is in a position of which the distance from the end section 32a of the base section 32 in the length direction L is near 45% of the width dimension S.

The mount electrodes 38A and 38B are provided in positions facing each other across the position n in the vicinity of the position n, and are provided within the mount region M defined between the position P1 which is at a distance of approximately 25% of the width dimension S from the end section 32a and the position P2 at a distance of approximately 65% of the width dimension S from the end section 32a. In addition, in this example, a positional relationship between the mount electrodes 38A and 38B, and the position n is set so as not to be overlapped, but the mount electrodes 38A and 38B, and the position n may be overlapped.

In addition, in the piezoelectric vibrating piece 3A, a pair of cutout sections 50 recessed along the width direction W orthogonal to the extending direction of the vibrating arm sections 30 and 31, and the support arm section 33 are formed in the base section 32. The pair of cutout sections 50 is also formed in portions on the side of the base section 32 from the mount position (the mount electrodes 38A and 38B) in the support arm section 33 with respect to the vibrating arm sections 30 and 31, respectively.

It is possible to easily attenuate the vibration transmitted from the vibrating arm sections 30 and 31 to the support arm section 33 with the cutout sections 50.

Moreover, the cutout sections 50 may be formed in only one of the base section 32 and the portion on the side of the base section 32 from the mount region M in the support arm section 33, and the cutout sections 50 may be omitted.

According to the above configuration, the piezoelectric vibrating piece 3A is mounted within the mount region M which is set in the range of which the distance from the end section 32a of the base section 32 to the side of the leading end 33b of the support arm section 33 is 45±20% with respect to the width dimension S of the base section 32 along the width direction W in the support arm section 33. Therefore, it is possible to suppress vibration leakage from the piezoelectric vibrating piece 3A as much as possible.

Moreover, in the embodiment, the mount electrodes 38A and 38B are described as a substantially square shape of 100 μm×100 μM but the size of the mount electrodes 38A and 38B is not limited to the embodiment. In the invention, the reason that the region which is set in the range of 45±20% with respect to the width dimension S of the base section 32 along the width direction W is the mount region M is to dispose the mount electrodes 38A and 38B in the vicinity of the position n as much as possible considering the sizes of the mount electrodes 38A and 38B, spread of the conductive adhesive and insulation between the mount electrodes 38A and 38B. Thus, it is possible to suppress the vibration leakage from the piezoelectric vibrating piece 3A as much as possible by mounting the piezoelectric vibrating piece 3A within the mount region M which is set in the range of 45±20% with respect to the width dimension S of the base section 32 in the width direction W. Moreover, it is possible to further effectively suppress the vibration leakage if the mount electrodes 38A and 38B can be provided in the range of 45±10% with respect to the width dimension S while considering the spread of the conductive adhesive or the insulation between the mount electrodes 38A and 38B.

Here, in the above description, the position of which the distance from the end section 32a of the base section 32 in the length direction L is 45% of the width dimension S is described as the nodal point (the node) where the vibration transmitted from the vibrating arm sections 30 and 31 to the support arm section 33 is suppressed as much as possible. However, there is a common nodal point regarding the position of which the distance from the end section 32a of the base section 32 is in the vicinity of 45% with respect to the width dimension S of the base section 32 along the width direction W in the support arm section 33 even if the length (the length from the base section 32 to the leading end 33b of the support arm section 33) of the support arm section 33 is varied in the length direction L.

This is derived from a simulation result and the invention is made based on the simulation result. That is, the related art has a technical idea for suppressing the vibration leakage by attenuating the vibration by extending the length of the support arm section 33, but the invention of this application is significantly different from the related art, in that it is found that the position of the node thereof greatly depends on the width dimension S of the base section 32 while finding the node of the vibration. As described above, the position of the node relevant to the width dimension of the base section has not been disclosed or suggested until now. Detailed description will be made on this point.

Figure 6A:
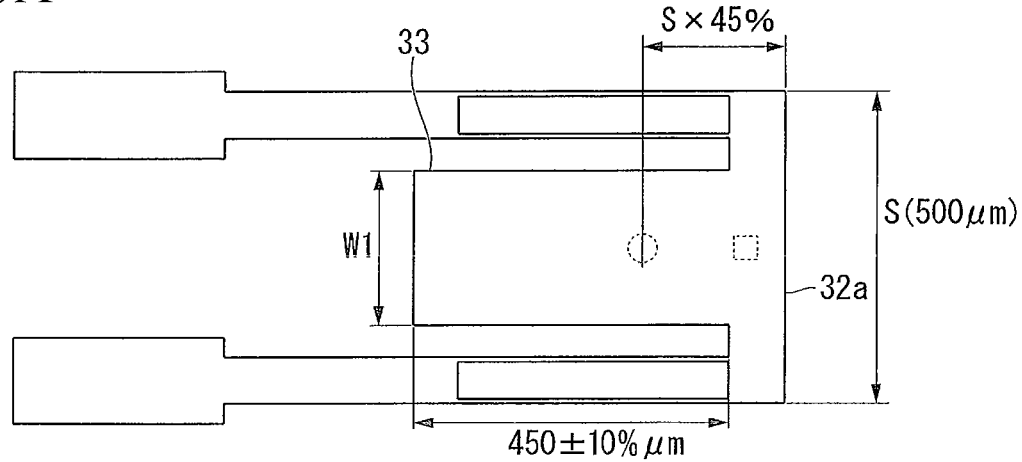
FIGS. 6A to 6C are views illustrating generating distribution of vibration when having different lengths in a support arm section of the piezoelectric vibrating piece.
Figure 6B:
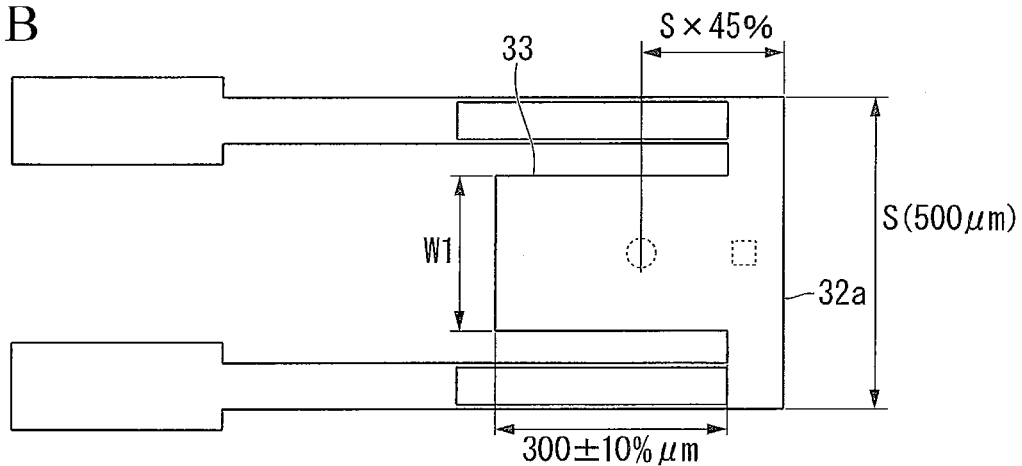
Figure 6C:
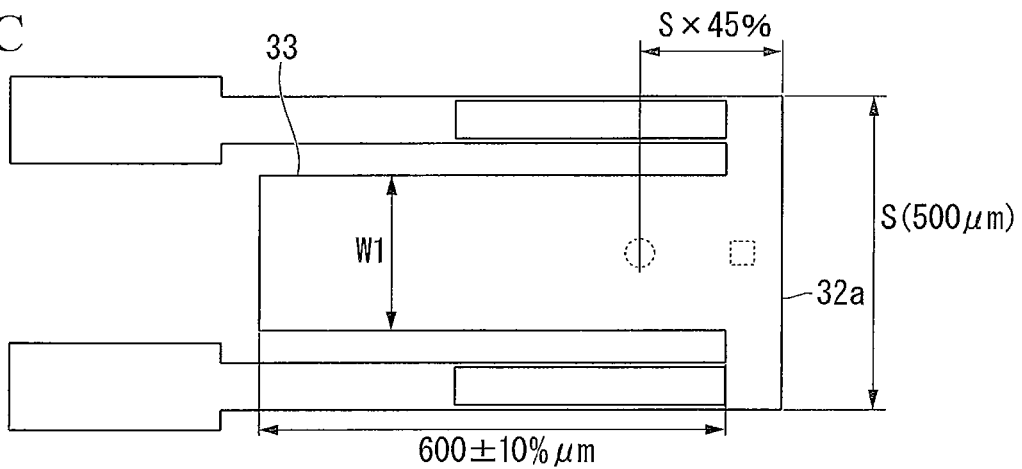

An example of the simulation is illustrated in FIGS. 6A to 6C. In each of cases where the length of the support arm section 33 of the piezoelectric vibrating piece 3A in the length direction L had different values from a predetermined value in a range of 450 μm±10%, a predetermined value in a range of 300 μm±10% and a predetermined value in a range of 600 μm±10%, an example of results of the vibration distribution in the piezoelectric vibrating piece 3A obtained by a simulation analysis is illustrated in FIGS. 6A to 6C. In addition, the width dimension S of the base section 32 was 500 μm and a width dimension W1 of the support arm section 33 in the width direction W was 200 mm.

In each of the drawings, "O" indicated by a dotted line illustrates a point where the vibration is suppressed on the vibrating arm section as much as possible, and in all cases, the distance from the end section 32a of the base section 32 in the length direction L is approximately 45% of the width dimension S or the vicinity thereof. By contrast, "□" indicated by a dotted line illustrates a point which is the most vibrated. In all cases, the point is a position that enters slightly into the base section 32 from the connecting position between the support arm section 33 and the base section 32.

As illustrated in the results, in all cases where the lengths of the support aim section 33 are 450 μm, 300 μm and 600 μm, in the support arm section 33, it was found that the vibration is great on the side of the end section 32a of the base section 32 and the position of which the distance from the end section 32a of the base section 32 is approximately near 45% of the width dimension S of the base section 32 is the portion where the vibration is suppressed as much as possible.

Moreover, in the above embodiment, examples of the specific dimensions of each section including the width dimension S of the base section 32 are given but the piezoelectric vibrating piece 3A is not limited to the given dimensions and it is possible to form each section with other appropriate dimensions.

In addition, the mount region M described above may be formed so as to include a position of the center of gravity of the piezoelectric vibrating piece 3A.

Here, as illustrated in FIGS. 5A and 5B, in the width direction orthogonal to the extending direction of the vibrating arm sections 30 and 31, and the support arm section 33, the width dimension W1 of the support arm section 33 is preferably 1.0 to 5.0 times a width dimension W2 of the vibrating arm sections 30 and 31, and a length dimension L1 of the support arm section 33 from the base section 32 is preferably 0.5 to 2.5 times the width dimension S of the base section 32. In this case, the position of the center of gravity of the piezoelectric vibrating piece 3A is easily positioned in the vicinity of the mount section (the mount electrodes 38A and 38B). Thus, it is possible to make a good balance in the installation of the piezoelectric vibrating piece 3A.

Second Embodiment

Next, a second embodiment of a piezoelectric vibrating piece according to the invention is described with reference to the drawings. It is possible to configure the piezoelectric vibrator 1 by incorporating a piezoelectric vibrating piece 3B illustrated in the embodiment in the package 2 in place of the piezoelectric vibrating piece 3A illustrated in the first embodiment. In the following description, the same reference numerals in the drawing are given to common configurations with respect to the first embodiment described above and the description thereof is omitted.

Figure 7:
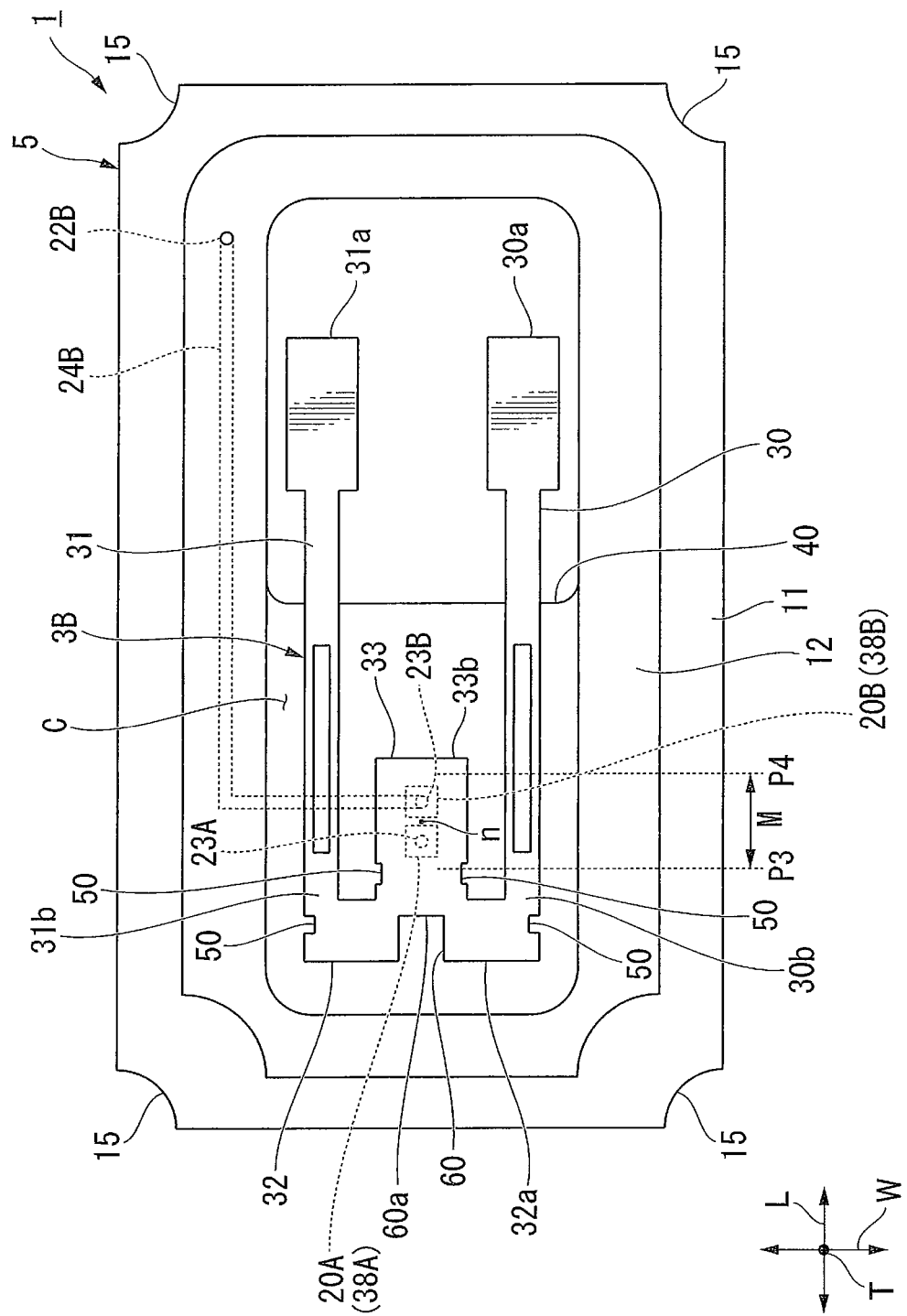
FIG. 7 is a top plan view of a piezoelectric vibrator according to a second embodiment of the invention.

As illustrated in FIG. 7, the piezoelectric vibrating piece 3B of the embodiment includes the pair of vibrating arm sections 30 and 31, the base section 32 to which each of the base ends 30b and 31b of the pair of vibrating arm sections 30 and 31 is connected and which extends in the width direction W, and the support arm section 33 that is connected to the base section 32 between the pair of vibrating arm sections 30 and 31, and extends from the base section 32 along the vibrating arm sections 30 and 31.

Then, a slit 60 is formed in the base section 32, which extends in the length direction L from the end section 32a on the opposite side to the side where the support arm section 33 is connected in the center portion in the width direction W between the vibrating arm section 30 of one side and the vibrating arm section 31 of the other side. The slit 60 is formed to extend from the end section 32a of the base section 32 to the side of the leading end 33b of the support arm section 33 along the extending direction of the support arm section 33.

The slit 60 is formed by cutting a portion where the vibration is the greatest, in the simulation results illustrated in FIGS. 6A to 6C.

In the piezoelectric vibrating piece 3B described above, the pair of mount electrodes 38A and 38B is mounted within a region in the support arm section 33, of which a distance from a leading end 60a of the slit 60, which is a portion positioned on the side of the leading end 33b of the support arm section 33 to the side of the leading end 33b of the support arm section 33 is 45±20% of the width dimension S of the base section 32, that is, within the mount region M that is defined between a position P3 which is at a distance of 25% of the width dimension S from the leading end 60a and a position P4 which is at a distance of 65% of the width dimension S from the leading end 60a. Thus, the pair of mount electrodes 38A and 38B are mounted so as to come into contact with the pair of electrode pads 20A and 20B.

According to the configuration described above, the piezoelectric vibrating piece 3B is mounted within the mount region M that is set in the range of which the distance from the leading end 60a of the slit 60 to the side of the leading end 33b of the support arm section 33 is 45±20% of the width dimension S of the base section 32 along the width direction W in the support arm section 33. Therefore, similar to the first embodiment, it is possible to effectively suppress the vibration leakage from the mount section of the support arm section 33 and it is possible to resonate the piezoelectric vibrating piece 3B with high sensitivity. Moreover, in the embodiment, the cutout sections 50 are formed similar to the first embodiment. In addition, in FIG. 7, the position n of which a distance from the leading end 60a to the side of the leading end 33b of the support arm section 33 is 45% of the width dimension S of the base section 32 is indicated. The mount electrodes 38A and 38B are provided in positions facing each other across the position n in the vicinity of the position n.

Third Embodiment

Next, a third embodiment of a piezoelectric vibrating piece according to the invention is described with reference to the drawings. It is possible to configure the piezoelectric vibrator 1 by incorporating a piezoelectric vibrating piece illustrated in the embodiment in the package 2 in place of the piezoelectric vibrating piece 3A illustrated in the first embodiment. In the following description, the same reference numerals in the drawings are given to common configurations with respect to the first and the second embodiments described above and the description thereof is omitted.

Figure 8:
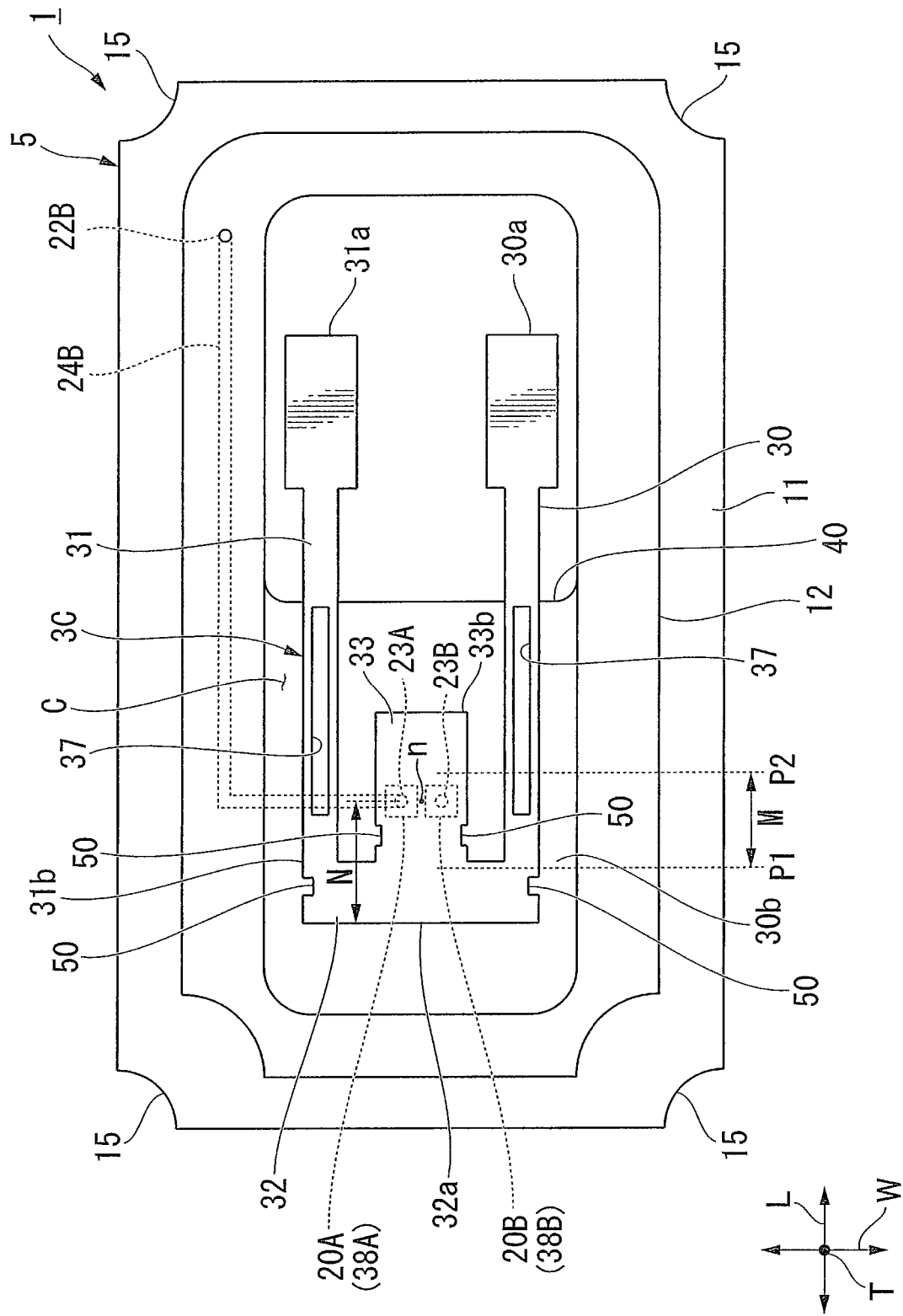
FIG. 8 is a top plan view of a piezoelectric vibrator according to a third embodiment of the invention.

As illustrated in FIG. 8, similar to the piezoelectric vibrating piece 3A of the first embodiment described above, a piezoelectric vibrating piece 3C of the embodiment includes the pair of vibrating arm sections 30 and 31, the base section 32 to which each of the base ends 30b and 31b of the pair of vibrating arm sections 30 and 31 is connected and which extends in the width direction W, and the support arm section 33 that is connected to the base section 32 between the pair of vibrating arm sections 30 and 31, and extends from the base section 32 along the vibrating arm sections 30 and 31.

Here, the pair of electrode pads 20A and 20B that are the connection electrodes connected to the piezoelectric vibrating piece 3C are formed at an interval in the width direction W in the mounting surface 11a of the second base substrate 11 and the pair of mount electrodes 38A and 38B that are the mount section are formed at an interval in the width direction W on the side of the piezoelectric vibrating piece 3C.

The piezoelectric vibrating piece 3C of the embodiment is mounted by the mount electrodes 38A and 38B within the mount region M that is defined in a range of which a distance from the end section 32a of the base section 32 to the side of the leading end 33b of the support arm section 33 is 45±20% of the width dimension S of the base section 32 in the support arm section 33 with respect to the pair of electrode pads 20A and 20B aligned in the width direction W thereof.

In addition, in FIG. 8, the position n of which a distance from the end section 32a to the side of the leading end 33b of the support arm section 33 is 45% of the width dimension S of the base section 32 is also indicated. The mount electrodes 38A and 38B are aligned in the width direction W in positions facing each other across the position n in the vicinity of the position n.

As described above, it is possible to effectively suppress the vibration leakage from the mount section of the support arm section 33 and it is possible to resonate the piezoelectric vibrating piece 3C with high sensitivity by mounting the piezoelectric vibrating piece 3C within the mount region M.

Fourth Embodiment; Oscillator

Next, an embodiment of an oscillator according to the invention is described with reference to FIG. 9.

Figure 9:
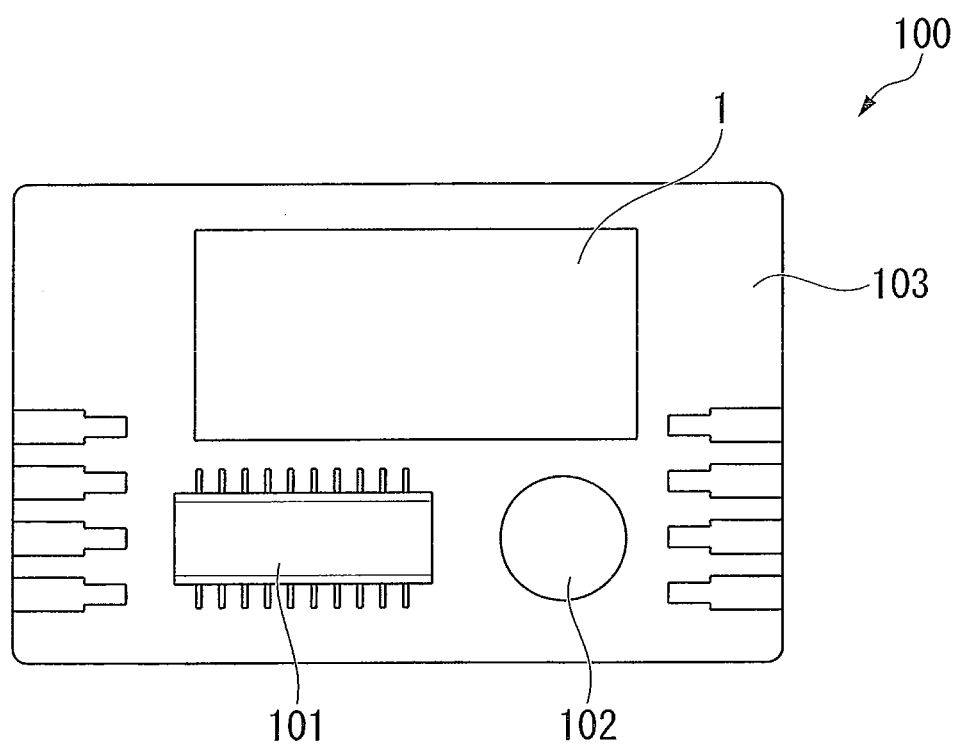
FIG. 9 is a configuration view illustrating an oscillator according to a fourth embodiment of the invention.

As illustrated in FIG. 9, an oscillator 100 according to the embodiment is configured as an oscillator in which the piezoelectric vibrator 1 illustrated in any one of the first to third embodiments described above is electrically connected to an integrated circuit 101. Here, the piezoelectric vibrator 1 includes the piezoelectric vibrating piece illustrated in the first embodiment.

The oscillator 100 includes a substrate 103 on which an electronic part 102 such as a capacitor is mounted. The integrated circuit 101 described above for the oscillator is mounted on the substrate 103 and the piezoelectric vibrator 1 is mounted in the vicinity of integrated circuit 101. The electronic part 102, the integrated circuit 101 and the piezoelectric vibrator 1 are electrically connected to each other by a wiring pattern (not illustrated). Moreover, each of the configuration parts is molded by a resin (not illustrated).

In the oscillator 100 configured as described above, if a voltage is applied to the piezoelectric vibrator 1, the piezoelectric vibrating piece vibrates in the piezoelectric vibrator 1. The vibration is converted into an electric signal by piezoelectric characteristics of the piezoelectric vibrating piece and is input into the integrated circuit 101 as an electric signal. Various types of processing are performed by the integrated circuit 101 on the input electric signal and the electric signal is output as a frequency signal. Therefore, the piezoelectric vibrator 1 functions as the oscillator.

In addition, it is possible to add functions for controlling an operation date and time or for supplying time and a calendar for an apparatus or an external apparatus in addition to a single-function oscillator for a timepiece or the like to the configuration of the integrated circuit 101 by selectively setting a real time clock (RTC) module or the like upon request.

As described above, according to the oscillator 100 of the embodiment, it is possible to provide the oscillator 100 which can effectively suppress the vibration leakage similar to the above embodiments by including the piezoelectric vibrator 1 described above.

Fifth Embodiment; Electronic Apparatus

Figure 10:
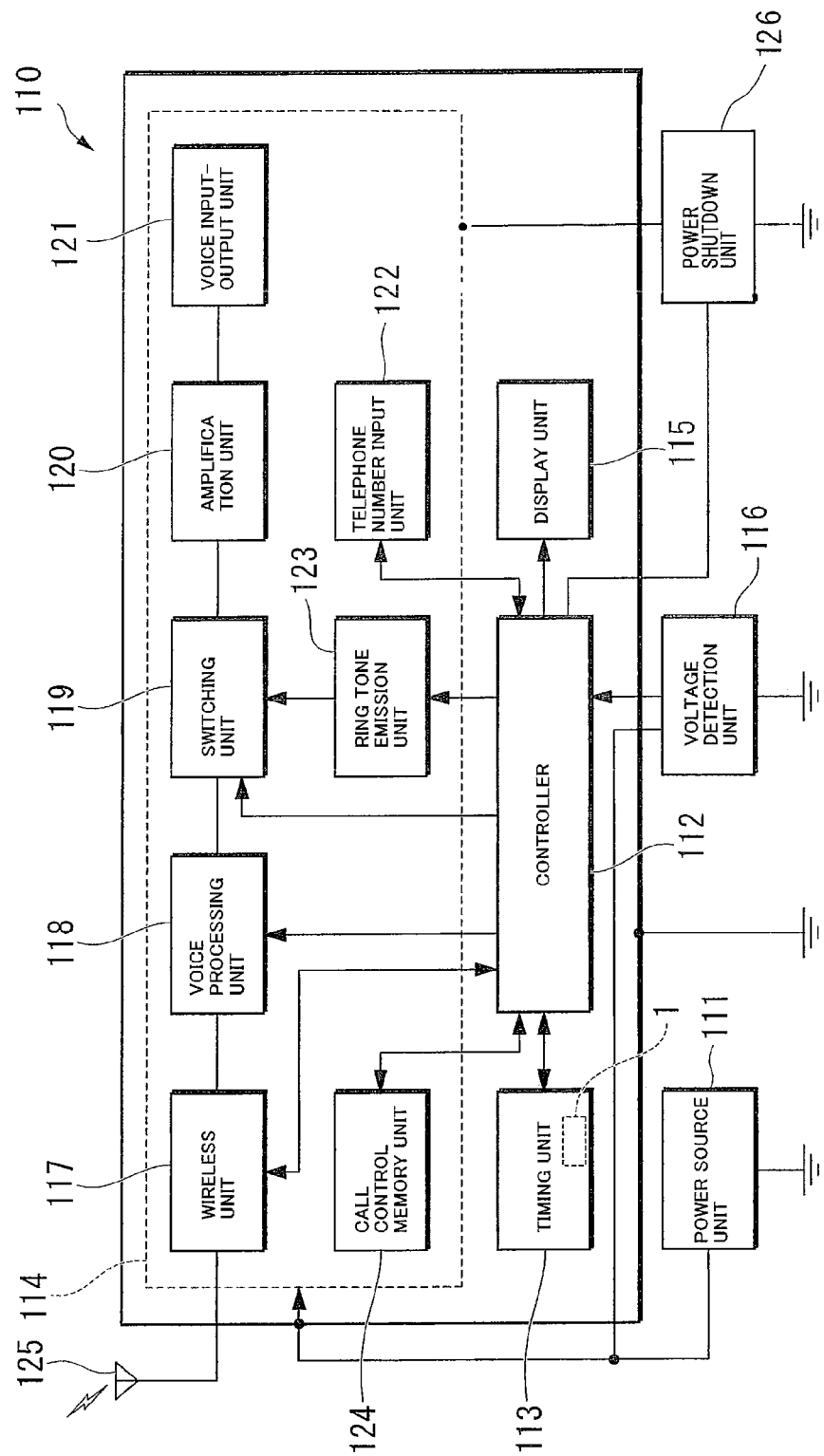
FIG. 10 is a configuration view illustrating an electronic apparatus according to a fifth embodiment of the invention.

Next, an embodiment of an electronic apparatus according to the invention is described with reference to FIG. 10. Moreover, as an example of the electronic apparatus, a portable information apparatus (electronic apparatus) 110 having the piezoelectric vibrator 1 illustrated in any one of the first to third embodiments described above is described. Here, the portable information apparatus 110 includes the piezoelectric vibrating piece illustrated in the first embodiment.

Here, the portable information apparatus 110 according to the embodiment is represented, for example, by a cellular phone, and develops and improves a wristwatch of the related art. An outer appearance thereof is similar to the wristwatch and a liquid crystal display is arranged in a portion corresponding to a dial, and a current time or the like can be displayed on a screen. In addition, in a case of being used as a communication apparatus, it is possible to perform the communication similar to the cellular phone of the related art by removing from the wrist and by using a speaker and a microphone which are incorporated in the inner portion of a band. However, the portable information apparatus can be significantly downsized and made lightweight compared to the cellular phone of the related art.

Next, a configuration of the portable information apparatus 110 of the embodiment is described. As illustrated in FIG. 10, the portable information apparatus 110 includes the piezoelectric vibrator 1 and a power supply section 111 for supplying electric power. For example, the power supply section 111 is formed of a lithium secondary battery. A controller 112 that performs various types of control, a timer section 113 that counts the time or the like, a communication section 114 that performs the communication with the outside, a display section 115 that displays various types of information, and a voltage detecting section 116 that detects the voltage of each of function sections are connected in parallel to the power supply section 111. Then, the power can be supplied to each of the function sections by the power supply section 111.

The controller 112 performs operational control of an entirety of the system such as transmitting and receiving of sound data, measuring or displaying of a current time or the like by controlling each of the function sections. In addition, the controller 112 includes a ROM in which program is written in advance, a CPU that reads and executes the program written in the ROM, a RAM that is used as a work area of the CPU or the like.

The timer section 113 includes an integrated circuit incorporating an oscillator circuit, a register circuit, a counter circuit, an interface circuit or the like, and the piezoelectric vibrator 1. If voltage is applied to the piezoelectric vibrator 1, the piezoelectric vibrating piece vibrates, the vibration is converted into an electric signal by the piezoelectric characteristics of the crystal and is input into the oscillator circuit as the electric signal. The output of the oscillator circuit is binarized and is counted by the register circuit and the counter circuit. Then, the signal is transmitted to and received from the controller 112 through the interface circuit and the current time, the current date, the calendar information or the like is displayed on the display section 115.

The communication section 114 has the same function as the cellular phone of the related art and includes a radio section 117, a voice processing section 118, a switching section 119, an amplifier 120, a voice input and output section 121, a phone number input section 122, a ring sound generator 123, and a call control memory section 124.

The radio section 117 transmits and receives various data such as voice data to/from a base station through an antenna 125. The voice processing section 118 codes and decodes the voice signal input from the radio section 117 or the amplifier 120. The amplifier 120 amplifies the signal input from the voice processing section 118 or the voice input and output section 121 to a predetermined level. The voice input and output section 121 is configured of a speaker, a microphone or the like, and amplifies the ring sound or reception voice, or collects sound.

In addition, the ring sound generator 123 generates the ring sound in response to a call from the base station. The switching section 119 switches the amplifier 120 connected to the voice processing section 118 into the ring sound generator 123 only when a call is received. Therefore, the ring sound generated in the ring sound generator 123 is output to the voice input and output section 121 through the amplifier 120.

Moreover, the call control memory section 124 stores a program relating to incoming and outgoing call control of the communication. In addition, the phone number input section 122 includes, for example, number keys from 0 to 9 and other keys, and the phone number of a call destination is input by pressing the number keys.

If the voltage applied to each of the function sections such as the controller 112 by the power supply section 111 is below a predetermined value, the voltage detecting section 116 detects the voltage drop and notifies the controller 112. At this time, the predetermined voltage value is a value that is set in advance as a minimum voltage required to stably operate the communication section 114 and, for example, is approximately 3 V. The controller 112 which receives the voltage drop notification from the voltage detecting section 116 prohibits operations of the radio section 117, the voice processing section 118, the switching section 119 and the ring sound generator 123. Particularly, stopping of the operation of the radio section 117 in which power consumption is great is essential. Furthermore, the fact that the communication section 114 cannot be used due to a deficiency of the battery power is displayed on the display section 115.

That is, the operation of the communication section 114 is prohibited by the voltage detecting section 116 and the controller 112, and the fact can be displayed on the display section 115. The display may be a text message and may be a x (cross) mark on a phone icon displayed in an upper portion of a display surface of the display section 115 as a more intuitive display.

Moreover, it is possible to further reliably stop the function of the communication section 114 by including a power shutdown section 126 capable of selectively cutting the power source of a portion according to the function of the communication section 114.

As described above, according to the portable information apparatus 110 of the embodiment, it is possible to provide the portable information apparatus 110 which can effectively suppress the vibration leakage similar to the above embodiments by including the piezoelectric vibrator 1 described above.

Sixth Embodiment; Radio Controlled Timepiece

Next, an embodiment of a radio controlled timepiece according to the invention is described with reference to FIG. 11. As an example of the radio controlled timepiece, a radio controlled timepiece 130 having the piezoelectric vibrator 1 illustrated in any one of the first to third embodiments described above is described. Here, the radio controlled timepiece 130 includes the piezoelectric vibrating piece illustrated in the first embodiment.

Figure 11:
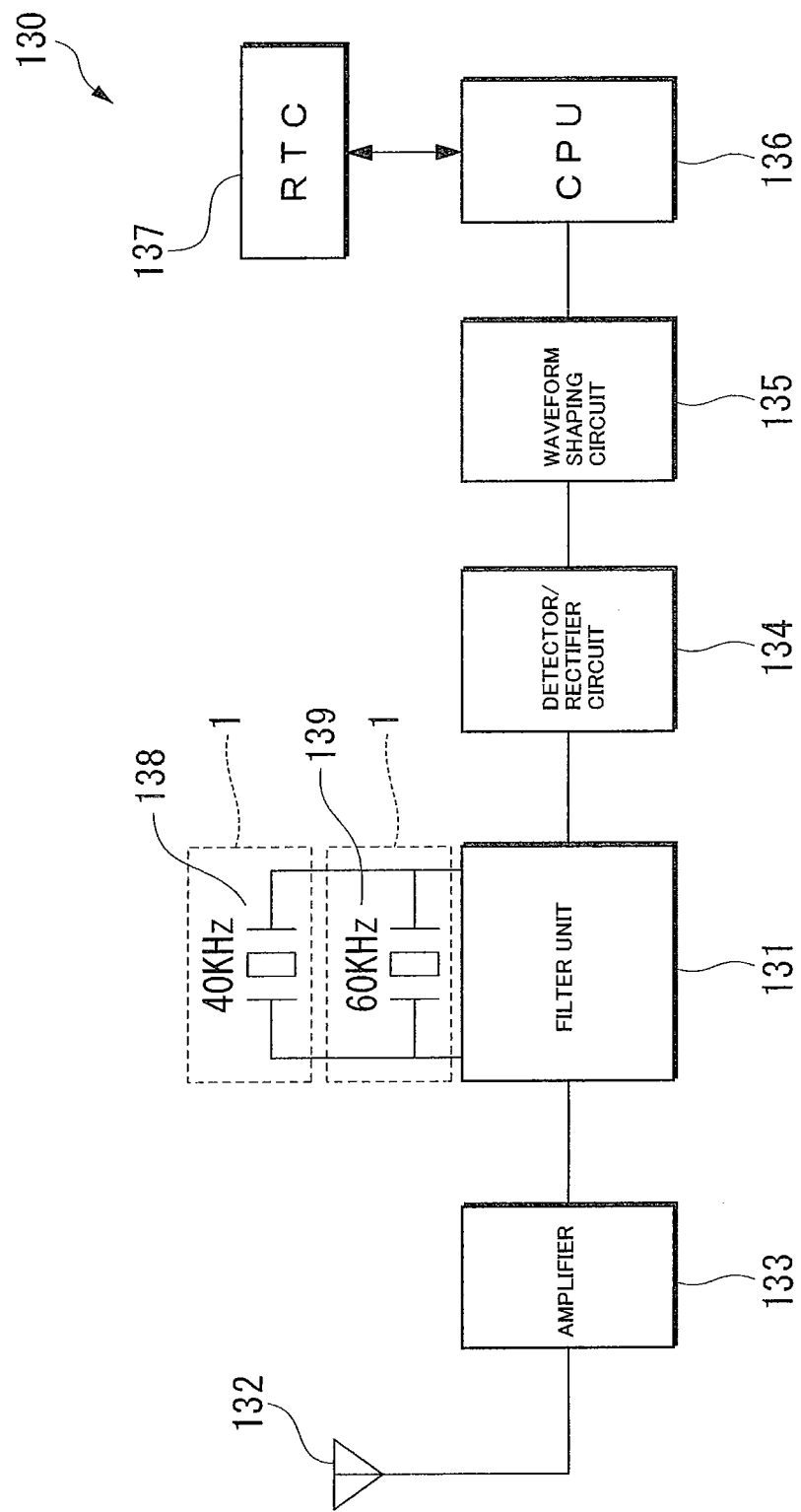
FIG. 11 is a configuration view illustrating a radio controlled timepiece of a sixth embodiment of the invention.

As illustrated in FIG. 11, the radio controlled timepiece 130 of the embodiment includes the piezoelectric vibrator 1 electrically connected to a filter section 131 and is a timepiece having functions for displaying the correct time by automatic correction by receiving a standard radio wave including timepiece information.

There are transmitting stations which transmit the standard radio waves in Fukushima (40 kHz) and Saga (60 kHz) in Japan, and the transmitting stations transmit the standard radio waves, respectively. Since a long wave such as 40 kHz or 60 kHz has both a property of propagating through the surface of the earth and a property of propagating through an ionized layer and the surface of the earth while being reflected, a propagation range is wide and can cover an entirety of Japan in the two transmitting stations described above.

Hereinafter, a functional configuration of the radio controlled timepiece 130 is described in detail.

An antenna 132 receives the standard radio wave of the long wave such as 40 kHz or 60 kHz. The standard radio wave of the long wave is obtained by applying AM modulation on a carrier wave of 40 kHz or 60 kHz to the time information referred to as a time code. The standard radio wave of the long wave which is received is amplified by an amplifier 133, and is filtered and tuned by the filter section 131 having a plurality of piezoelectric vibrators 1.

The piezoelectric vibrators 1 of the embodiment include crystal vibrator sections 138 and 139 having the resonance frequency of 40 kHz and 60 kHz which is the same as the carrier frequency described above, respectively.

Further, a signal of a predetermined frequency which is filtered is detected and demodulated by a detection and rectification circuit 134. Then, the time code is extracted through a waveform shaping circuit 135 and is counted in a CPU 136. The CPU 136 reads information such as a current year, a number of a day, a day of the week, time or the like. The information that is read is reflected in an RTC 137 and correct time information is displayed.

Since the carrier wave is 40 kHz or 60 kHz, as the crystal vibrator sections 138 and 139, the vibrator having the tuning fork type structure described above is suitable.

Moreover, the above description is illustrated in the example in Japan but the frequency of the standard radio wave of the long wave is different in foreign countries. For example, the standard radio wave of 77.5 KHz is used in Germany. Therefore, if the radio controlled timepiece 130 capable of corresponding to the foreign countries is incorporated in the portable apparatus, it is further necessary to provide the piezoelectric vibrator 1 having the frequency different from that in Japan.

As described above, according to the radio controlled timepiece 130 of the embodiment, it is possible to provide the radio controlled timepiece 130 which can effectively suppress the vibration leakage similar to the above embodiments by including the piezoelectric vibrator 1 described above.

The embodiments of the invention are described in detail with reference to the drawings but a specific configuration is not limited to the embodiments and other modifications or the like are also included without departing from the scope of the invention.

For example, in the above embodiments, as an example of the piezoelectric vibrator, the piezoelectric vibrator 1 of the ceramic package type is exemplified but the invention is not limited to the embodiment. For example, the piezoelectric vibrator of the surface mount type may be formed by further fixing a piezoelectric vibrator of a glass package type, a piezoelectric vibrator of a surface mount type, a piezoelectric vibrator of a cylinder package type, a piezoelectric vibrator of the surface mount type, and the piezoelectric vibrator of the cylinder package type with a resin mold section. In addition, even though not described in detail above, the piezoelectric vibrator according to the invention is characterized by having "a mount electrode positioning process" in which the positions of the mount electrodes 38A and 38B are determined, based on the width dimension S of the base section 32 in the manufacturing process thereof. That is, after determining the outer appearance dimension, the groove dimension or the like based on a predetermined design value, the mount electrode positioning process is performed, and after determining the positions of the mount electrodes 38A and 38B capable of effectively suppressing the vibration leakage, the piezoelectric vibrator is formed by an outer appearance forming process that forms the outer appearance of the piezoelectric vibrating piece 3A, a groove forming process that forms the grooves in the vibrating arm sections 30 and 31, an electrode forming process that forms electrodes in the base section 32, the vibrating arm sections 30 and 31, and the support arm section 33, and an individualizing process that individualizes the piezoelectric vibrating piece 3A from the wafer similar to the related art.

In the related art, the process in which the position of the mount electrode is determined based on the width dimension of the base section is not disclosed or suggested. Further, there is no disclosure regarding technical idea which pays attention to the positional relationship between the width dimension of the base section and the mount electrode. Therefore, it can be said that the manufacturing method is not conventional and is a method which is characterized by not being readily apparent from the related art.

Further, the base substrate is configured of two sheets of the first base substrate 10 and the second base substrate 11, but the base substrate may be configured of one sheet of the substrate and the concave section 40 may be formed on the mounting surface 11a. However, as described above, the base substrate is preferably configured of two sheets of the first base substrate 10 and the second base substrate 11. In this case, since the concave section 40 can be easily formed by bonding both the base substrates after forming the through hole in the second base substrate 11, it is possible to reduce the cost or the processing and the time for forming the concave section.

In addition, it is also possible to appropriately replace the configuration elements in the embodiments described above with the well-known configuration elements in a range without departing from the scope of the invention, and the modification examples described above may be appropriately combined.

What is claimed is:

1. A piezoelectric vibrator in which a piezoelectric vibrating piece is accommodated in a package, the piezoelectric vibrating piece comprising:
 a pair of vibrating arm sections disposed at a distance from each other in a width direction of a base section,
 wherein base ends of the pair of vibrating arm sections are connected to the base section; and
 a support arm section connected to the base section between the pair of vibrating arm sections and extending from the base section to a same side as the pair of vibrating arm sections,
 wherein the piezoelectric vibrating piece is supported within the package by mount sections in the support arm section, and
 wherein, the mount sections are in a mount region of the support arm section between an end section of the base section opposite to the support arm section and a leading end of the support arm section, where the mount region extends along the support arm section from 25% to 65% of a width dimension of the base section.

2. The piezoelectric vibrator according to claim 1, wherein a width dimension of the support arm section is 1.0 to 5.0 times a width dimension of the vibrating arm sections in a width direction orthogonal to an extending direction of the vibrating arm sections and the support arm section, and wherein a length dimension of the support arm section from the base section is 0.5 to 2.5 times the width dimension of the base section.

3. The piezoelectric vibrator according to claim 1, wherein the base section includes a cutout section recessed along the width direction in at least one side of a portion of the base section between the mount sections in the base section and the end section of the base section.

4. An oscillator comprising:
 the piezoelectric vibrator according to claim 1,
 wherein the piezoelectric vibrator is electrically connected to an integrated circuit as an oscillator.

5. An electronic apparatus comprising:
 the piezoelectric vibrator according to claim 1,
 wherein the piezoelectric vibrator is electrically connected to a timer section.

6. A radio controlled timepiece comprising:
 the piezoelectric vibrator according to claim 1,
 wherein the piezoelectric vibrator is electrically connected to a filter section.

7. The piezoelectric vibrator according to claim 1, wherein the mount region corresponds to a node in the support arm section.

\* \* \* \* \*